(12) United States Patent
Javor et al.

(10) Patent No.: US 7,245,655 B1
(45) Date of Patent: Jul. 17, 2007

(54) DUAL ANTENNA RECEIVER

(75) Inventors: Ronald Javor, Phoenix, AZ (US); Malcolm Smith, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 806 days.

(21) Appl. No.: 10/634,173

(22) Filed: Aug. 5, 2003

(51) Int. Cl.
*H07L 27/00* (2006.01)

(52) U.S. Cl. .................. 375/216; 375/220; 375/267; 375/316; 375/340; 329/301; 329/302; 329/305; 329/306; 455/132; 455/146

(58) Field of Classification Search ............... 375/267, 375/316, 216, 220, 324, 327, 330, 283, 340; 329/301, 302, 305–307, 323–325, 358–360; 455/132, 137, 146
See application file for complete search history.

(56) References Cited

U.S. PATENT DOCUMENTS

| 6,728,517 B2 * | 4/2004 | Sugar et al. .................. 455/73 |
| 6,876,836 B2 * | 4/2005 | Lin et al. ...................... 455/73 |
| 2002/0150185 A1 * | 10/2002 | Meehan et al. | |

* cited by examiner

*Primary Examiner*—Dac V. Ha
(74) *Attorney, Agent, or Firm*—The Law Offices of John C. Scott LLC

(57) ABSTRACT

Structures and techniques for implementing multiple-antenna configurations within a radio frequency receiver are provided. In one aspect, a modularized multi-antenna receiver is provided having multiple independent microelectronic dice mounted on a common module substrate. In another aspect, a multi-antenna receiver is provided that utilizes at least one single ended low noise amplifier and at least one differential low noise amplifier within a common receiver.

31 Claims, 3 Drawing Sheets

DUAL ANTENNA RECEIVER

FIELD OF THE INVENTION

The invention relates generally to wireless communications and, more particularly, to radio frequency (RF) receivers.

DETAILED DESCRIPTION

Figure 1:
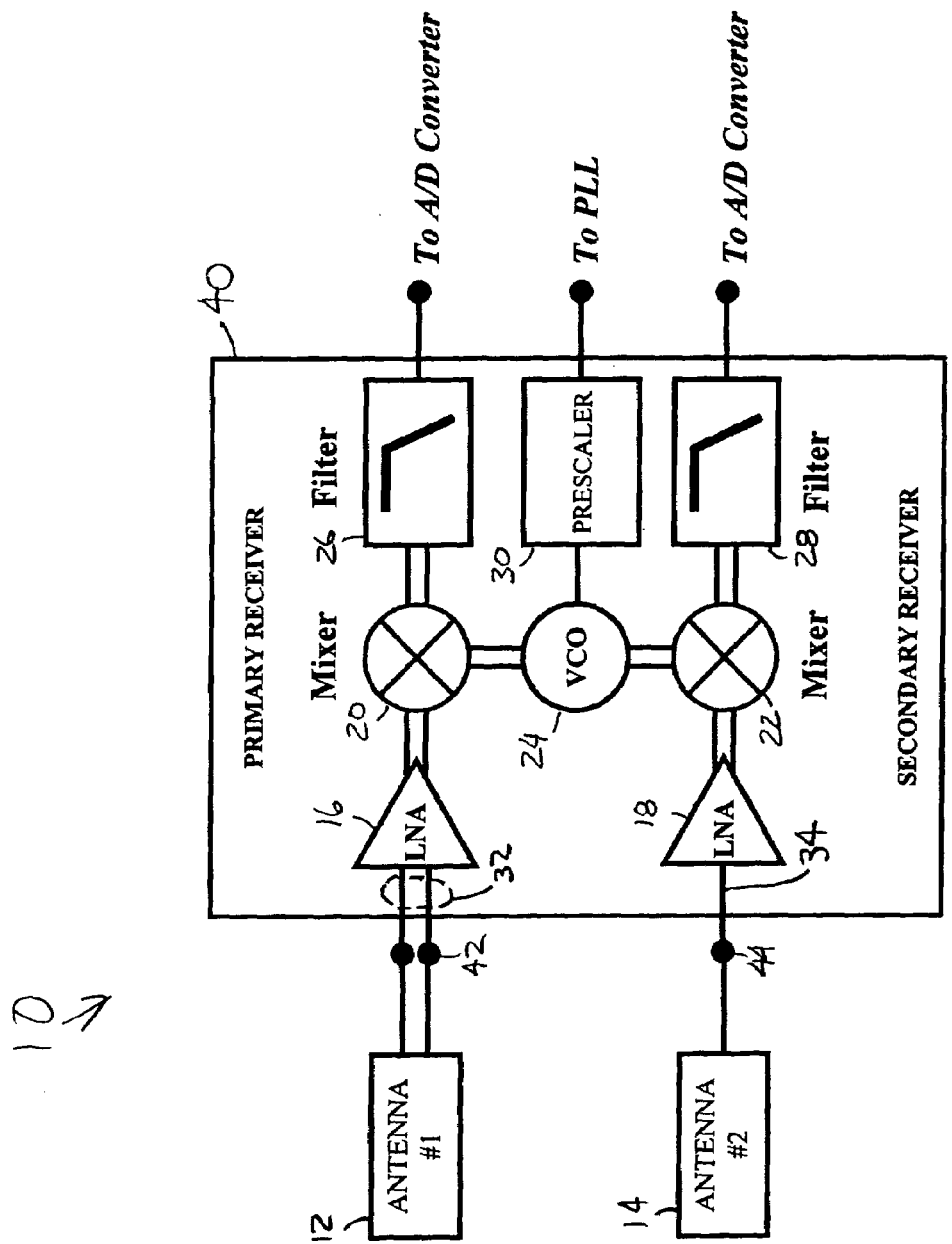
FIG. 1 is a block diagram illustrating an example dual antenna receiver arrangement in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Dual antenna receivers utilize two or more receive antennas to overcome reception problems caused by effects such as, for example, multipath fading and strong interference from unwanted signals. Each of the antennas typically requires a dedicated receiver chain to properly process a corresponding receive signal. The outputs of the receiver chains may then be digitized and digitally processed to generate the overall receiver output. Because information from two or more receive antennas is available, receiver sensitivity and channel capacity may be improved significantly.

FIG. 1 is a block diagram illustrating an example dual antenna receiver arrangement 10 in accordance with an embodiment of the present invention. The receiver arrangement 10 is depicted comprising one or more of: first and second antennas 12, 14, first and second low noise amplifiers (LNAs) 16, 18, first and second mixers 20, 22, a voltage controlled oscillator 24, first and second filters 26, 28, and a prescaler 30. The first LNA 16, the first mixer 20, and the first filter 26 may form a primary receiver chain within the dual antenna receiver. Likewise, the second LNA 18, the second mixer 22, and the second filter 28 may form a secondary receiver chain within the dual antenna receiver. The VCO 24 may generate local oscillator (LO) signals for the first and second mixers 20, 22 for use in performing frequency conversion (e.g., down conversion, etc.) on corresponding receive signals. The prescaler 30 may be operative for counting down the VCO output frequency for use in the feedback loop of a corresponding phased locked loop (PLL). The first and second filters 26, 28 may filter the frequency converted output signals of the first and second mixers 20, 22, respectively, before the signals are delivered to corresponding analog-to-digital (A/D) converters. The digital output signals of the A/D converters are then processed together in a known manner to generate the output signal of the dual antenna receiver.

In the embodiment illustrated in FIG. 1, the first LNA 16 uses a differential LNA architecture having a differential input 32 to receive a signal from the first antenna 12. The second LNA 18, on the other hand, uses a single-ended architecture having a single-ended input 34 to receive a signal from the second antenna 14. Differential LNA architectures are typically capable of achieving higher performance than single-ended LNA architectures. However, differential architectures are usually more complex and have higher component counts than corresponding single-ended structures. Thus, a single-ended LNA will typically consume less area on a semiconductor chip than a differential LNA. In an dual-antenna receiver, many of the benefits of using a dual-antenna configuration (e.g., increased receiver sensitivity, increased channel capacity, etc.) may still be achieved even if the performance of the secondary receiver chain (and/or any additional receiver chains) is inferior to that of the primary receiver chain. Therefore, by combining at least one receiver chain having a single-ended LNA with at least one receiver chain having a differential LNA in an dual-antenna receiver system, some or all of the advantages of dual-antenna configuration may be achieved in a less complex and smaller circuit.

The first and second antennas 12, 14 may include any of a wide variety of antenna types including, for example, patch antennas, dipoles, helical antennas, loop antennas, horn antennas, antenna arrays, and others, including combinations of different types of antennas. One or more baluns and/or bandselect filters may also be used. With reference to FIG. 1, in at least one implementation, the first and second LNAs 16, 18, the first and second mixers 20, 22, the VCO 24, the first and second filters 26, 28, and the prescaler 30 are implemented on a single semiconductor chip 40. The chip 40 may also include antenna terminals 42, 44 for connection to external antennas. Additional circuitry may also be implemented on the chip 40. Many other configurations are also possible, including multi-chip implementations. In at least one embodiment, the first and second antennas 12, 14 are implemented on a common semiconductor chip as the first and second LNAs 16, 18 (using, e.g., microstrip patch antennas or the like). As used herein, the word "terminal" refers to any conductive structure to which an external electrical connection can be made (e.g., a bond pad, a contact pad, a solder ball or bump, a pin, a socket, etc.).

Figure 2:
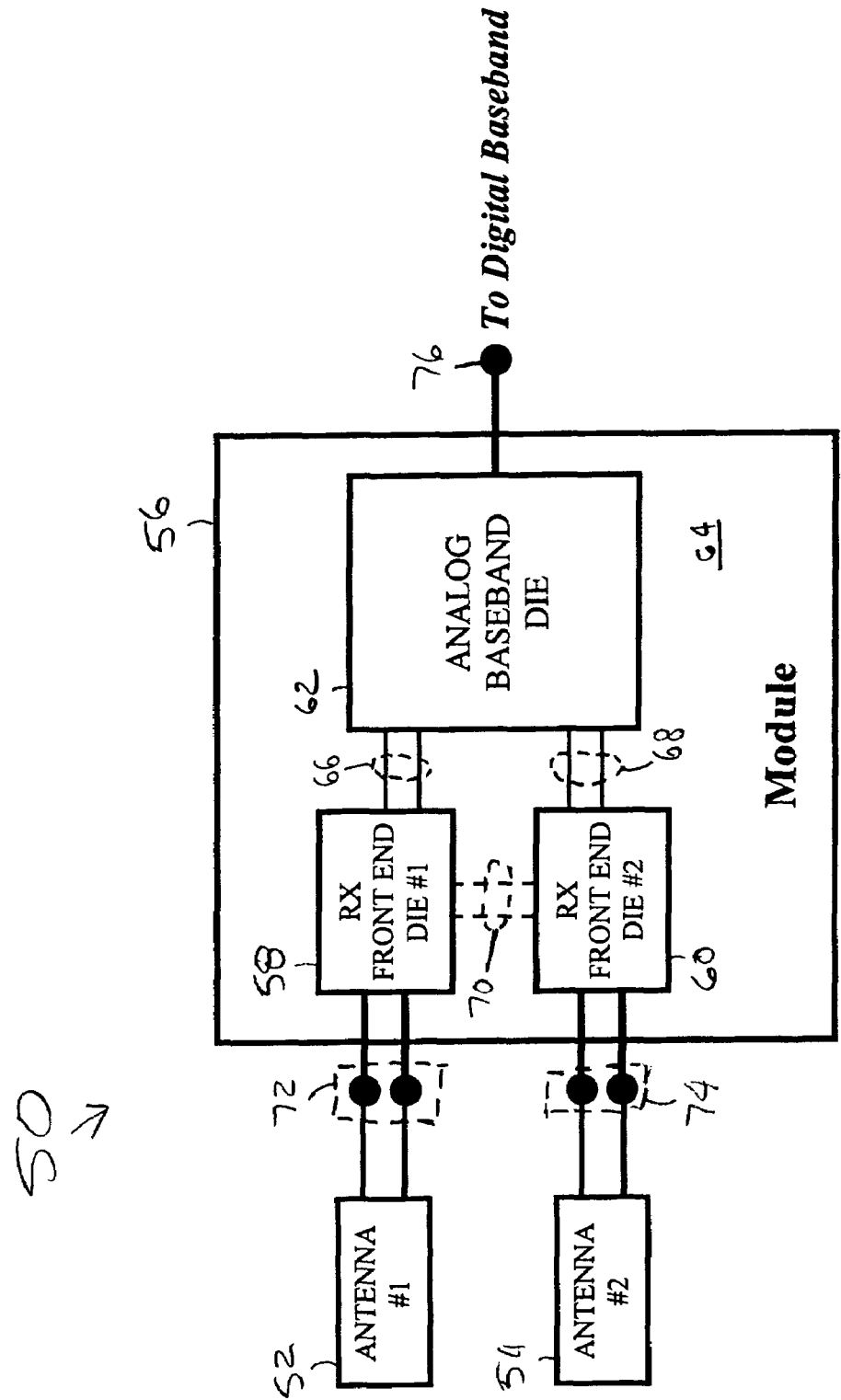
FIG. 2 is a block diagram illustrating an example modularized dual antenna receiver arrangement in accordance with an embodiment of the present invention.

FIG. 2 is a block diagram illustrating an example dual antenna receiver arrangement 50 in accordance with an embodiment of the present invention. As illustrated, the receiver arrangement 50 includes first and second antennas 52, 54 coupled to a receiver module 56. The receiver module 56 is depicted comprising one or more of: a first microelectronic die 58 carrying a first receiver front end, a second microelectronic die 60 carrying a second receiver front end, and a third microelectronic die 62 carrying analog baseband circuitry, all mounted on an underlying substrate 64. A first interconnect 66 provides communication between an output of the first microelectronic die 58 and a first input of the third microelectronic die 62. A second interconnect 68 provides communication between an output of the second microelectronic die 60 and a second input of the third microelectronic die 62. A third interconnect 70 may also be used to provide communication between the first and second microelectronic dice 58, 60. In at least one embodiment, as illustrated in FIG. 2, antenna terminals 72, 74 are provided on the receiver module 56 for connection to external antennas 52, 54. In other embodiments, first and second antennas 52, 54 are provided on the substrate 64 of the module 56 using, for example, microstrip patch elements or the like. An output terminal 76 may also be provided on the module 56 for connection to, for example, digital baseband circuitry.

In at least one embodiment, the first and second microelectronic dice 58, 60 may each include a low noise amplifier (LNA) to amplify a signal received from a corresponding antenna 12, 14 and a mixer to frequency convert (e.g., down convert, etc.) the amplified signal. Either the first microelectronic die 58 or the second microelectronic die 60 may also include a voltage controlled oscillator (VCO) to generate a local oscillator (LO) signal for the mixers of the first and second microelectronic dice 58, 60. The third interconnect 70 may be used, for example, to carry an LO signal from a front end die having a VCO to the other front end die. In other embodiments, a separate VCO chip may be provided in the module with corresponding inter-chip routing to deliver LO signals to the appropriate mixers. In still other embodiments, additional front end die are provided, with corresponding inter-chip routing, to support operation with additional antennas. In at least one implementation, a module is provided that includes a single die having both the first receiver front end and the second receiver front end implemented thereon, instead of two independent front end die. The analog baseband die 62 may include, for example, one or more of analog-to-digital (A/D) converters, digital-to-analog (D/A) converters, phase locked loops, modulators, digital channel filters, reference oscillators, power management functionality, analog application functionality, and/or other functionality.

In at least one embodiment, the first, second, and third interconnects 66, 68, 70 include relatively low loss transmission line structures. By using low loss transmission line structures between independent microelectronic dice in a modular layout, significant performance improvements may be achieved by eliminating the relatively lossy interconnect structures typically associated with traditional integrated circuit (IC) packaging with its parasitic impedances. The modular approach may also cement the inter-chip RF routing for quick and reliable customer design in. In one possible approach, one or more of the interconnects 66, 68, 70 are implemented using metallization deposited on the substrate 64. For example, in at least one implementation, microstrip techniques are used to implement the interconnects on the substrate 64. That is, one or more conductive traces may be formed on a first surface of the substrate 64 for each interconnect with a corresponding ground plane on an opposing surface thereof. Microstrip design techniques are well known. Other forms of transmission line may alternatively or additionally be used. The first, second, and third interconnects 66, 68, 70 may be differential or single-ended structures.

The first, second, and third microelectronic dice 58, 60, 62 may be coupled to the substrate 64 in any of a variety of different ways including using, for example, flip chip techniques, wire bonding techniques, and/or other techniques. In at least one embodiment, the substrate 64 includes a dielectric board formed from a dielectric material such as, for example, alumina and/or other ceramics, duroid, Teflon-based glass laminates, epoxy resin glass laminates, polyimide, cyanate esters, and/or others. In other embodiments, semiconductor based substrates (e.g., silicon, etc.) may be used. Other substrate materials are also possible. In some implementations, a covering will be provided for the module to provide protection for the various dice. This covering may include, for example, a plastic cap, a metal cap (shield), glob-top encapsulation, and/or others.

Figure 3:
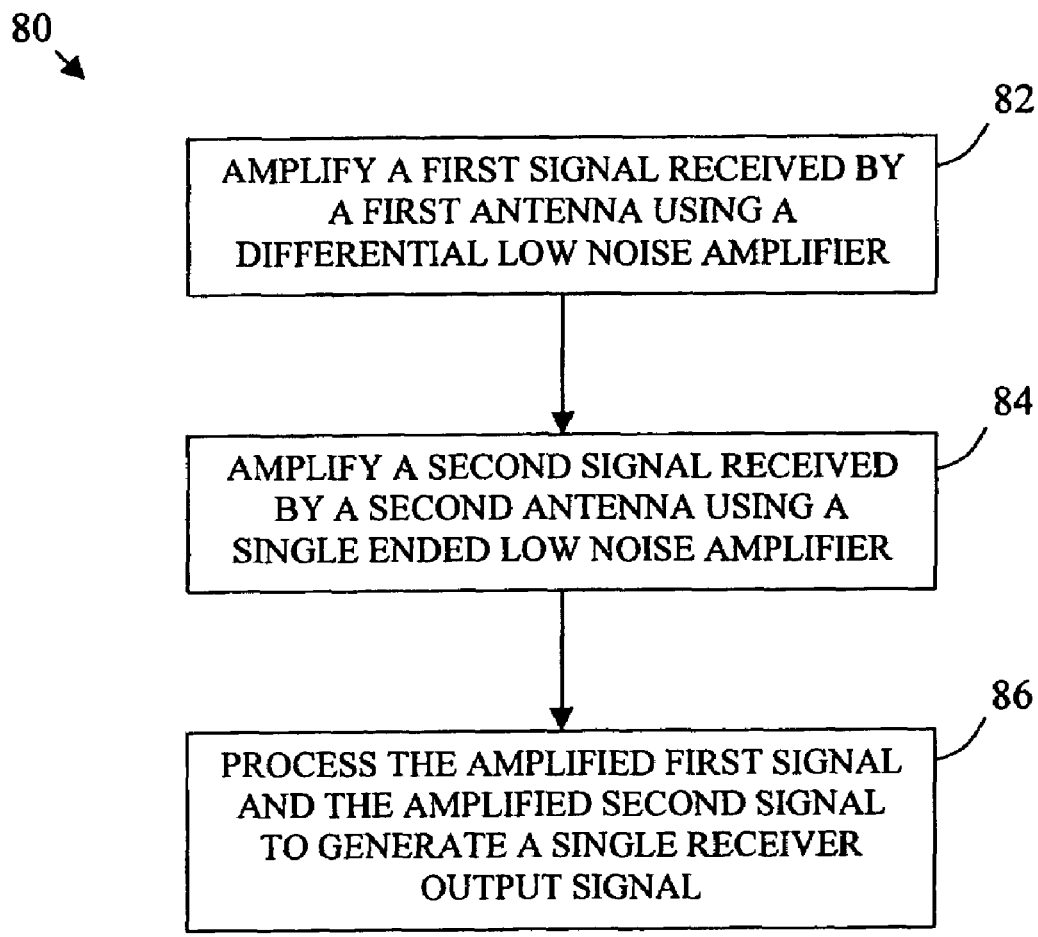
FIG. 3 is a flowchart illustrating an example method for use in a multiple antenna receiver in accordance with an embodiment of the present invention.

FIG. 3 is a flowchart illustrating an example method 80 for use in a multiple antenna receiver. A first signal received by a first antenna is amplified within a differential low noise amplifier (LNA) to generate an amplified first signal (block 82). A second signal received by a second antenna is amplified within a single ended LNA to generate an amplified second signal (block 84). The amplified first signal and the amplified second signal are then processed to generate a single receiver output signal (block 86). In at least one embodiment, the processing of the amplified first signal and the amplified second signal includes frequency converting (e.g., down converting, etc.) each of the signals. The frequency converted signals may then be filtered and digitized. The digitized signals may then be processed together digitally to generate a single receiver output signal (e.g., using well known antenna diversity techniques, etc.). Other techniques for processing the amplified first signal and the amplified second signal may alternatively be used.

In the embodiments described above, the inventive features are discussed in the context of dual antenna receivers. It should be appreciated, however, that at least some of the inventive features have application in radio frequency receivers utilizing three or more antennas.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A module comprising:

a substrate;

a first microelectronic die mounted on said substrate, said first microelectronic die including a first receiver front end to process a signal received by a first antenna;

a second microelectronic die mounted on said substrate, said second microelectronic die including a second receiver front end to process a signal received by a second antenna, said second microelectronic die being different from said first microelectronic die;

a third microelectronic die mounted on said substrate, said third microelectronic die including analog baseband circuitry to process baseband output signals of said first and second receiver front ends, said third microelectronic die being different from said first and second microelectronic dies;

a first interconnect coupled between an output of said first microelectronic die and a first input of said third microelectronic die; and
a second interconnect coupled between an output of said second microelectronic die and a second input of said third microelectronic die.

2. The module of claim 1, wherein:
at least one of said first interconnect and said second interconnect includes a differential transmission line.

3. The module of claim 1, wherein:
at least one of said first interconnect and said second interconnect includes a metallization portion formed on a surface of said substrate.

4. The module of claim 1, wherein:
at least one of said first interconnect and said second interconnect includes a microstrip transmission line formed on said substrate.

5. The module of claim 1, wherein:
said substrate includes a ground plane that forms a part of said first and second interconnects.

6. The module of claim 1, wherein:
said substrate includes a dielectric board material.

7. The module of claim 1, wherein:
said substrate includes alumina.

8. The module of claim 1, wherein:
said substrate includes a semiconductor material.

9. The module of claim 1, comprising:
at least one first terminal for connection to a first external antenna, said at least one first terminal being coupled to said first microelectronic die; and
at least one second terminal for connection to a second external antenna, said at least one second terminal being coupled to said second microelectronic die.

10. The module of claim 1, comprising:
a third interconnect coupled between said first microelectronic die and said second microelectronic die.

11. The module of claim 10, wherein:
said first receiver front end includes a first low noise amplifier (LNA) to amplify a signal from a first antenna and a first mixer to frequency convert an output signal of said first LNA; and
said second receiver front end includes a second LNA to amplify a signal from a second antenna and a second mixer to frequency convert an output signal of said second LNA;
wherein said second microelectronic chip further includes a voltage controlled oscillator to generate local oscillator signals for said first and second mixers, said third interconnect to carry a corresponding local oscillator signal to said first microelectronic die for use by said first mixer.

12. The module of claim 1, comprising:
a fourth microelectronic die mounted on said substrate, said fourth microelectronic die including a third receiver front end to process a signal received by a third antenna; and
a fourth interconnect coupled between an output of said fourth microelectronic die and a third input of said third microelectronic die.

13. A multi-antenna receiver system, comprising:
a first low noise amplifier (LNA) having a differential input to receive a signal from a first antenna;
a second LNA having a single-ended input to receive a signal from a second antenna;
a first mixer to perform a frequency conversion on an amplified output signal of said first LNA;
a second mixer to perform a frequency conversion on an amplified output signal of said second LNA; and
a voltage controlled oscillator (VCO) to provide a local oscillator signal to said first and second mixers.

14. The receiver system of claim 13, wherein:
said first and second LNAs, said first and second mixers, and said VCO are implemented on a common semiconductor chip.

15. The receiver system of claim 13, further comprising:
a first filter to filter a frequency converted output signal of said first mixer, said first filter having an output for connection to a first analog to digital (A/D) converter; and
a second filter to filter a frequency converted output signal of said second mixer, said second filter having an output for connection to a second A/D converter.

16. The receiver system of claim 15, wherein:
said first and second LNAs, said first and second mixers, said VCO, and said first and second filters are implemented on a common semiconductor chip.

17. The receiver system of claim 13, further comprising:
a prescaler to count down an output frequency of said VCO for use in a feedback loop of a corresponding phased locked loop (PLL), wherein said first and second LNAs, said first and second mixers, said VCO, and said prescaler are implemented on a common semiconductor chip.

18. The receiver system of claim 13, further comprising:
a third LNA having a single-ended input to receive a signal from a third antenna; and
a third mixer to perform a frequency conversion on an amplified output signal of said third LNA.

19. A system comprising:
a first patch antenna;
a second patch antenna;
a substrate;
a first microelectronic die mounted on said substrate, said first microelectronic die including a first receiver front end to process a signal received by said first patch antenna;
a second microelectronic die mounted on said substrate, said second microelectronic die including a second receiver front end to process a signal received by said second patch antenna, said second microelectronic die being different from said first microelectronic die;
a third microelectronic die mounted on said substrate, said third microelectronic die including analog baseband circuitry to process baseband output signals of said first and second receiver front ends, said third microelectronic die being different from said first and second microelectronic dies;
a first interconnect coupled between an output of said first microelectronic die and a first input of said third microelectronic die; and
a second interconnect coupled between an output of said second microelectronic die and a second input of said third microelectronic die.

20. The system of claim 19, wherein:
said system includes a handheld communicator.

21. The system of claim 19, wherein:
said first and second interconnects include differential transmission lines.

22. The system of claim 19, wherein:
said first and second interconnects include metallization portions formed on a surface of said substrate.

23. The system of claim 19, wherein:
said first and second interconnects are microstrip transmission lines formed on said substrate.

24. The system of claim 19, wherein:
said substrate includes a dielectric board material.

25. The system of claim 19, wherein:
said substrate includes a semiconductor material.

26. The system of claim 19, wherein:
said substrate, said first, second, and third microelectronic dice, and said first and second interconnects are part of a single receiver module.

27. A method comprising:
amplifying a first signal received by a first antenna using a differential low noise amplifier (LNA) to generate an amplified first signal;
amplifying a second signal received by a second antenna using a single ended LNA to generate an amplified second signal; and
processing said amplified first signal and said amplified second signal to generate a single receiver output signal.

28. The method of claim 27, wherein:
processing includes frequency converting said amplified first signal and said amplified second signal.

29. The method of claim 28, wherein:
processing includes filtering said amplified first signal and said amplified second signal after frequency converting.

30. The method of claim 29, wherein:
processing includes converting said amplified first signal and said amplified second signal to a digital format after filtering to generate a digitized first signal and a digitized second signal.

31. The method of claim 30, wherein:
processing includes digitally processing said digitized first signal and said digitized second signal together to generate said single receiver output signal.

* * * * *